United States Patent
Jia

(10) Patent No.: US 8,673,663 B2
(45) Date of Patent: *Mar. 18, 2014

(54) METHOD FOR MANUFACTURING ARRAY SUBSTRATE OF TRANSFLECTIVE LIQUID CRYSTAL DISPLAY

(75) Inventor: Pei Jia, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 39 days.

This patent is subject to a terminal disclaimer.

(21) Appl. No.: 13/509,996

(22) PCT Filed: Mar. 11, 2012

(86) PCT No.: PCT/CN2012/072166
§ 371 (c)(1),
(2), (4) Date: May 15, 2012

(87) PCT Pub. No.: WO2013/131284
PCT Pub. Date: Sep. 12, 2013

(65) Prior Publication Data
US 2013/0236998 A1    Sep. 12, 2013

(30) Foreign Application Priority Data
Mar. 6, 2012  (CN) .......................... 2012 1 0056791

(51) Int. Cl.
*H01L 21/00* (2006.01)

(52) U.S. Cl.
USPC .......................................................... 438/30

(58) Field of Classification Search
USPC ....................................................... 438/29, 30
See application file for complete search history.

(56) References Cited

U.S. PATENT DOCUMENTS 8,470,622 B1 *   6/2013   Jia ................................. 438/30
8,486,740 B1 *   7/2013   Jia et al. ........................ 438/30

* cited by examiner

*Primary Examiner* — William D Coleman
(74) *Attorney, Agent, or Firm* — Cheng-Ju Chiang

(57) ABSTRACT

A method for manufacturing an array substrate of a transflective LCD includes: (1) providing a substrate; (2) forming a transparent electrode layer on the substrate and forming a first metal layer on the transparent electrode layer; (3) applying a first photo-masking operation to form a gate terminal and a pixel electrode; (4) forming an insulation layer on the gate terminal and the pixel electrode; (5) applying a second photo-masking operation to form a gate insulation layer on the insulation layer; (6) forming a semiconductor layer on the gate insulation layer and forming a second metal layer on the semiconductor layer and the pixel electrode; and (7) applying a third photo-masking operation to form a channel layer on the semiconductor layer and also forming a drain terminal, a source terminal, and a reflector section on the second metal layer, so as to form a thin-film transistor.

8 Claims, 5 Drawing Sheets

METHOD FOR MANUFACTURING ARRAY SUBSTRATE OF TRANSFLECTIVE LIQUID CRYSTAL DISPLAY

BACKGROUND OF THE INVENTION

1. Field of the Invention

The present invention relates to the technical field of liquid displaying, and in particular to a method for manufacturing an array substrate of a transflective liquid crystal display (LCD)

2. The Related Arts

Displays that are currently available in the market can be roughly divided into three categories according to the light source used, including transmissive LCD, reflective LCD, and transflective LCD. The transmissive LCD is applicable in conditions of weak surrounding light, such as indoor environment. When used outdoors, due to the intense external light, the intensity of the backlight source is severely affected, making human eyes perceiving excessive panel brightness and thus making image unclear, and eventually affecting image quality. In addition, long term use of the backlight source would lead to a great consumption of electrical power. Since a small-sized display is often powered by electrical battery, it often occurs that power storage soon gets exhausted. The reflective LCD is applicable for conditions with intense external light source for in the structure thereof, a reflector is provided for reflecting away the intense light in order to minimize the influence of the external light source. Such a structure is compact and light-weighted and saves power consumption. However, a problem of insufficient lighting may occurs in the conditions of weak surrounding lighting, and thus affecting the image quality. The transflective LCD has two different display modes. In a dark environment, a transmissive mode dominates, where a backlight source of the LCD emits light through a liquid crystal panel to display image; and in a condition where sufficient lighting exists, such as sunlight, a reflective mode dominates, where a reflector of the liquid crystal panel reflects away the external light to serve as light source for displaying image. Thus, the transflective LCD is fit for various outdoor environments with intense lighting, and can particularly provide excellent outdoor viewability but requires only less brightness of the light source and shows an advantage of low power consumption.

An LCD is generally composed of an upper substrate and a lower substrate between which liquid crystal is interposed. The upper substrate is the so-called color filter substrate, which generally comprises a common electrode and a color filter. The lower substrate is the so called array substrate, which generally comprises thin-film transistor (TFT) and pixel electrode. The color filter substrate forms the color filter through multiple photo-masking operations. The array substrate usually uses four to six masks and is subjected to multiple masking processes including film deposition, mask exposure, and etching to form arrayed arrangements of thin-film transistors and pixel electrodes. The greater the number of mask used in the array substrate manufacturing process is, the greater the number of manufacturing steps has to be taken. This leads to high disqualification rate and makes it hard to control costs.

The conventional method for manufacturing a transflective array substrate includes an additional process, which is carried out after the completion of manufacturing thin-film transistors to form a reflector section. This complicates the manufacturing process and increases the costs.

SUMMARY OF THE INVENTION

An object of the present invention is to provide a method for manufacturing an array substrate of a transflective liquid crystal display (LCD), which simplifies the manufacturing process of the array substrate, shortens the manufacturing time, and reduces the manufacturing costs.

To achieve the above object, the present invention provides a method for manufacturing an array substrate of a transflective LCD, which comprises the following steps:

Step 1: providing a substrate;

Step 2: forming a transparent electrode layer on the substrate and forming a first metal layer on the transparent electrode layer;

Step 3: applying a first photo-masking operation to form a gate terminal and a pixel electrode of a predetermined pattern, wherein the pixel electrode is formed with the transparent electrode layer and is exposed and the gate terminal is formed with the transparent electrode layer and the first metal layer;

Step 4: forming an insulation layer on the gate terminal and the pixel electrode;

Step 5: applying a second photo-masking operation to form a gate insulation layer of a predetermined pattern on the insulation layer;

Step 6: forming a semiconductor layer on the gate insulation layer and forming a second metal layer on the semiconductor layer and the pixel electrode; and Step 7: applying a third photo-masking operation to form a channel layer of a predetermined pattern on the semiconductor layer and also forming a drain terminal, a source terminal, and a reflector section of a predetermined pattern on the second metal layer, so as to form a thin-film transistor, wherein the drain terminal is electrically connected to the pixel electrode.

The first photo-masking operation uses a grey-tone mask or a half-tone mask to perform exposure, development, and etching on the transparent electrode layer and the first metal layer to form the gate terminal and the pixel electrode of a predetermined pattern. The gate terminal is formed on the substrate with a portion of the transparent electrode layer and a portion of the first metal layer that is disposed on said portion of the transparent electrode layer. The pixel electrode and the gate terminal are spaced from each other. The pixel electrode is formed with another portion of the transparent electrode layer.

The third photo-masking operation uses a grey-tone mask or a half-tone mask to perform exposure, development, and etching on the semiconductor layer and the second metal layer to form the channel layer, the drain terminal, the source terminal, and the reflector section of a predetermined pattern. The channel layer is formed on the gate insulation layer and partly extends to the pixel electrode. The drain terminal and the source terminal are spaced and respectively arranged at two ends of the channel layer. The drain terminal has an end extending along the channel layer to reach the pixel electrode. The reflector section is located on the pixel electrode.

The transparent electrode layer comprises an indium tin oxide layer.

After Step 7, Step 8, in which a planarization layer is formed on the thin-film transistor, is included.

The planarization layer of Step 8 comprises a transparent insulation layer.

The first metal layer, the second metal layer, and the transparent electrode layer are formed with sputtering operations.

The insulation layer, the semiconductor layer, and the planarization are formed with chemical vapor deposition operations.

The efficacy of the preset invention is that the present invention provides a method for manufacturing array substrate of transflective LCD, which uses only three photo-masking operations to complete the manufacture of array substrate of transflective LCD, thereby simplifying the manufacturing process, shortening the manufacturing time, and reducing the manufacturing costs.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, will be apparent from the following detailed description of an embodiment of the present invention, with reference to the attached drawings. In the drawings.

DETAILED DESCRIPTION OF THE PREFERRED EMBODIMENTS

Figure 1:
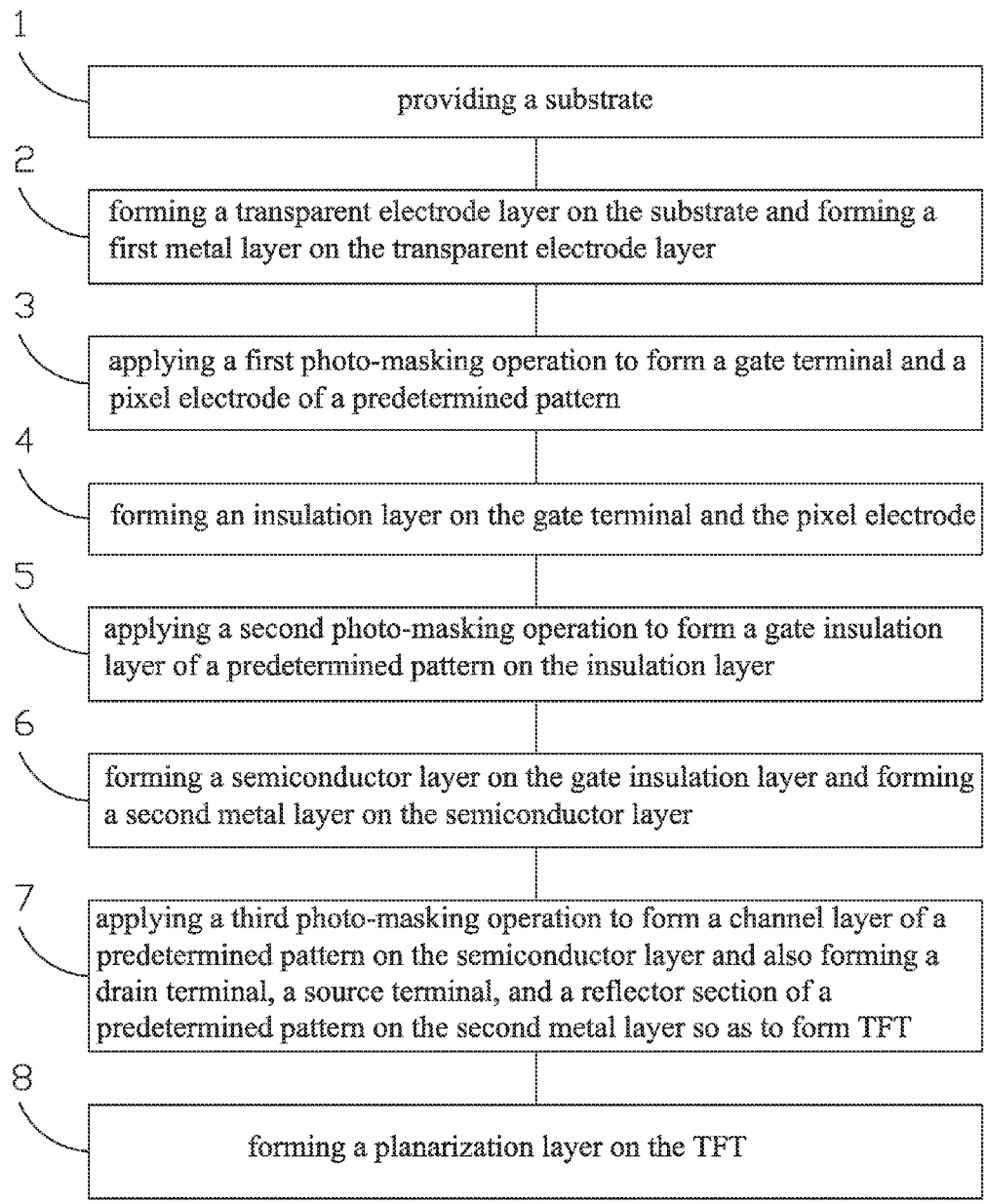
FIG. 1 is a flow chart showing a method for manufacturing array substrate of transflective liquid crystal display (LCD) according to the present invention.
Figure 2:
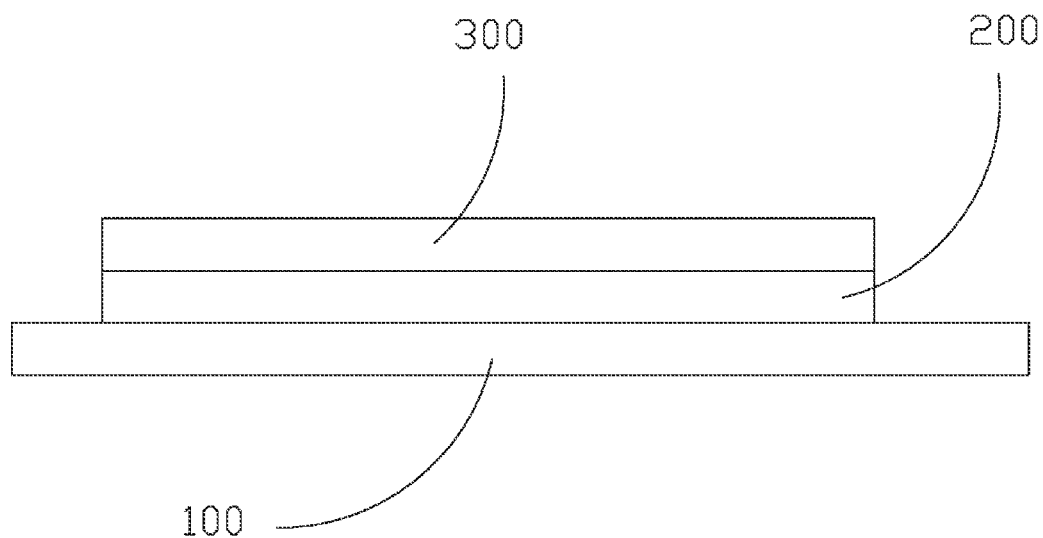
FIGS. 2-6 are schematic views showing steps of the manufacture of array substrate of transflective LCD according to an embodiment of the present invention.
Figure 3:
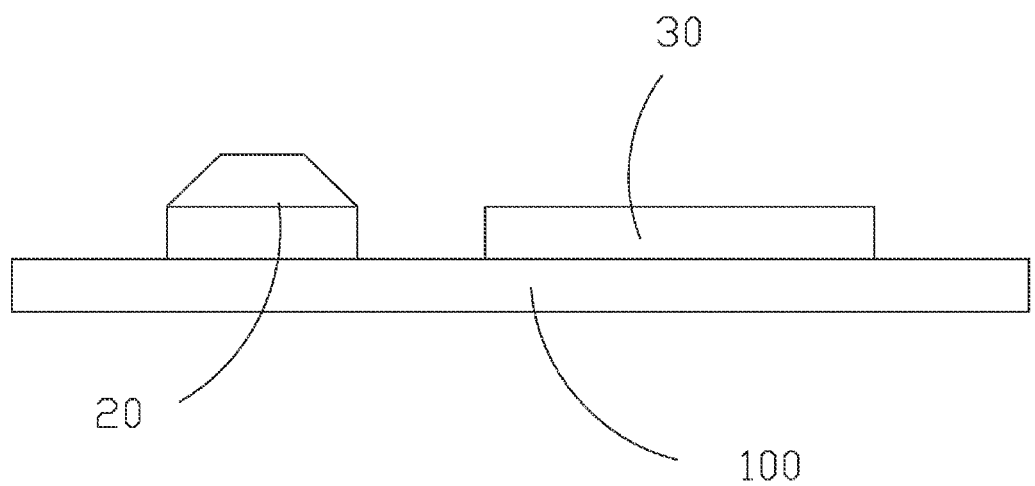
Figure 4:
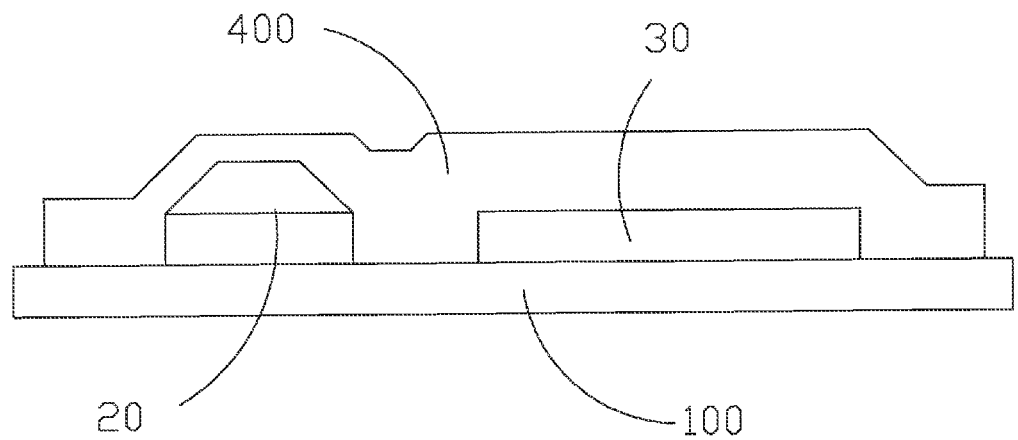

To further expound the technical solution adopted in the present invention and the advantages thereof, a detailed description is given to a preferred embodiment of the present invention and the attached drawings.

Referring to FIGS. 1-6, the present invention provides a method for manufacturing an array substrate of a transflective LCD, which comprises the following steps:

Step 1: providing a substrate 100, wherein the substrate 100 is made of a light-transmitting material and is generally a glass substrate, a quartz substrate, or a substrate of other suitable material.

Step 2: forming a transparent electrode layer 200 on the substrate 100 and forming a first metal layer 300 on the transparent electrode layer 200 (see FIG. 2), wherein the transparent electrode layer 200 comprises an indium tin oxide (ITO) layer and the transparent electrode layer 200 and the first metal layer 300 are made with sputtering operations, the material of the first metal layer 300 being molybdenum, tungsten, chromium, aluminum, copper, or laminations thereof, or other suitable material.

Step 3: applying a first photo-masking operation to form a gate terminal 20 and a pixel electrode 30 of a predetermined pattern (see FIG. 3), wherein the pixel electrode 30 is formed with the transparent electrode layer 200 and is exposed, and the gate terminal 20 is formed with the transparent electrode layer 200 and the first metal layer 300.

The first photo-masking operation uses a grey-tone mask or a half-tone mask to perform exposure, development, and etching on the transparent electrode layer 200 and the first metal layer 300 to form the gate terminal 20 and the pixel electrode 30 of the predetermined pattern. The gate terminal 20 is formed on the substrate 100 with a portion of the transparent electrode layer 200 and a portion of the first metal layer 300 that is disposed on said portion of the transparent electrode layer 200. The pixel electrode 30 and the gate terminal 20 are spaced from each other. The pixel electrode 30 is formed with another portion of the transparent electrode layer 200. The first photo-masking operation is carried out by coating a layer of photo-sensitive material, namely a photoresist layer, on the first metal layer 300 and then projecting light through the grey-tone mask or the half-tone mask to irradiate the photoresist layer for exposure of the photoresist layer. Since the grey-tone mask or the half-tone mask carries thereon a pattern of source zone, allowing a portion of the light to transmit through the grey-tone mask or the half-tone mask to irradiate the photoresist layer makes the exposure of the photoresist layer selective by which the pattern of the grey-tone mask or the half-tone mask is completely duplicated on the photoresist layer. Then, a proper developer is applied to remove a portion of the photoresist, making the photoresist layer show the desired pattern. Then, an etching operation is applied to remove a portion of the first metal layer 300 and a portion of the transparent electrode layer 200. The etching operation used herein can be wet etching, dry etching, or both. Finally, the remaining patternized photoresist layer is completely removed to form the gate terminal 20 and the pixel electrode 30 of the predetermined pattern.

Step 4: forming an insulation layer 400 on the gate terminal 20 and the pixel electrode 30 (see FIG. 4), wherein the insulation layer 400 is formed through chemical vapor deposition (CVD) and the insulation layer 400 is usually an oxide layer or can alternatively be a nitride layer, or a layer of a suitable insulation material, or a composite layer of these insulation layers.

Figure 5:
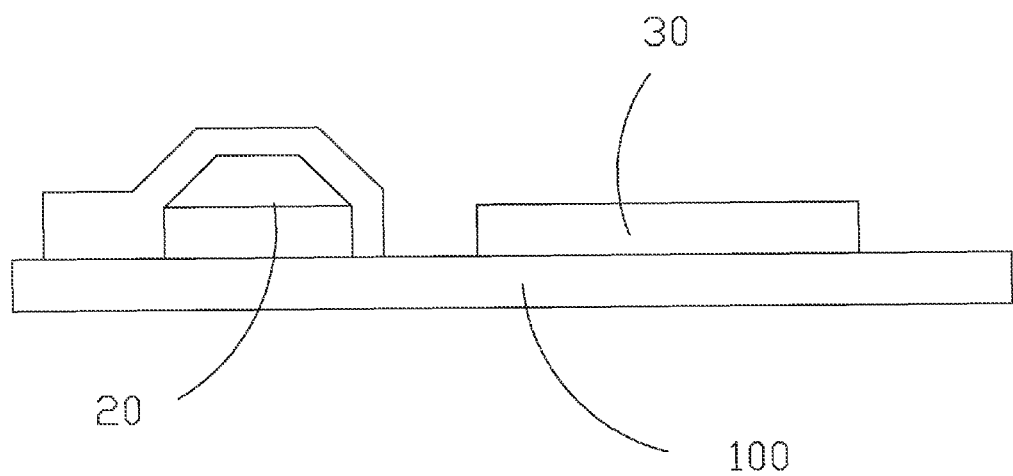
Figure 6:
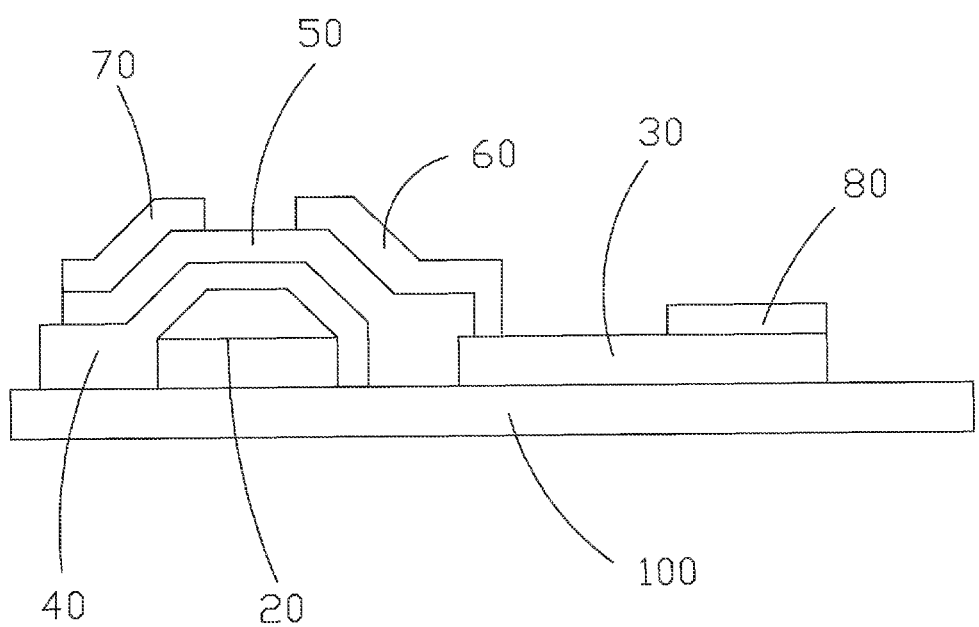

Step 5: applying a second photo-masking operation to form a gate insulation layer 40 of a predetermined pattern on the insulation layer 400 (see FIG. 5).

Step 6: forming a semiconductor layer (not shown) on the gate insulation layer 40 and forming a second metal layer (not shown) on the semiconductor layer and the pixel electrode 30, wherein the semiconductor layer is formed with CVD and the semiconductor layer is a polysilicon layer; the second metal layer is formed with sputtering and the material of the second metal layer can be molybdenum, tungsten, chromium, aluminum, copper, or laminations thereof, or other suitable material.

Step 7: applying a third photo-masking operation to form a channel layer 50 of a predetermined pattern on the semiconductor layer and also forming a drain terminal 60, a source terminal 70, and a reflector section 80 of a predetermined pattern on the second metal layer (see FIG. 6), so as to form a thin-film transistor (TFT), wherein the drain terminal 60 is electrically connected to the pixel electrode 30.

The third photo-masking operation uses grey-tone mask or half-tone mask to perform exposure, development, and etching on the semiconductor layer and the second metal layer to form the channel layer 50, the drain terminal 60, the source terminal 70, and the reflector section 80 of the predetermined pattern. The channel layer 50 is formed on the gate insulation layer 40 and partly extends to the pixel electrode 30. The drain terminal 60 and the source terminal 70 are spaced and respectively arranged at two ends of the channel layer 50. Further, the drain terminal 60 has an end extending along the channel layer 50 to reach the pixel electrode 30 to form the TFT. The third photo-masking operation is the same as the previous photo-masking operations and it is noted here that in the etching operation, the portion of the channel layer 50 corresponding to the drain terminal 60 is excessively and partly etched so that an end portion of the drain terminal 60 loses support and thus extends atop the pixel electrode 30 to allow the drain terminal 60 and the pixel electrode 30 to be electrically connected.

Step 8: forming a planarization layer on the TFT, wherein the planarization layer comprises a transparent insulation layer formed through CVD.

Figure 7:
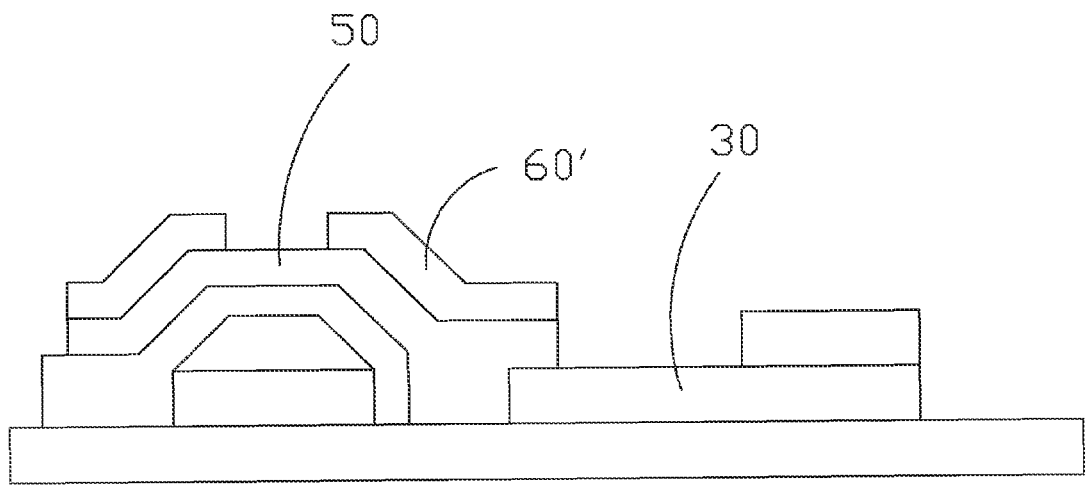
FIG. 7 is a schematic view showing another structure of array substrate that is manufactured with the method for manufacturing array substrate of transflective LCD according to the present invention.

Referring to FIG. 7, a schematic view is given to show the structure of array substrate that is manufactured with the method for manufacturing array substrate of transflective LCD according to the present invention. The array substrate formed with such a structure is different from the previous manufacturing process in that in Step 7, the third photo-masking operation uses the grey-tone mask or the half-tone mask to carry out exposure, development, and etching on the insulation layer so that the drain terminal 60' formed on the semiconductor layer is completely located in the channel layer 50 and the drain terminal 60' is electrically connected through the channel layer 50 to the pixel electrode 30.

In summary, the present invention provides a method for manufacturing array substrate of transflective LCD, which uses only three photo-masking operations to complete the manufacture of array substrate of transflective LCD, thereby simplifying the manufacturing process, shortening the manufacturing time, and reducing the manufacturing costs.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing an array substrate of a transflective liquid crystal display (LCD), comprising the following steps:
    Step 1: providing a substrate;
    Step 2: forming a transparent electrode layer on the substrate and forming a first metal layer on the transparent electrode layer;
    Step 3: applying a first photo-masking operation to form a gate terminal and a pixel electrode of a predetermined pattern, wherein the pixel electrode is formed with the transparent electrode layer and is exposed and the gate terminal is formed with the transparent electrode layer and the first metal layer;
    Step 4: forming an insulation layer on the gate terminal and the pixel electrode;
    Step 5: applying a second photo-masking operation to form a gate insulation layer of a predetermined pattern on the insulation layer;
    Step 6: forming a semiconductor layer on the gate insulation layer and forming a second metal layer on the semiconductor layer and the pixel electrode; and
    Step 7: applying a third photo-masking operation to form a channel layer of a predetermined pattern on the semiconductor layer and also forming a drain terminal, a source terminal, and a reflector section of a predetermined pattern on the second metal layer, so as to form a thin-film transistor, wherein the drain terminal is electrically connected to the pixel electrode.

2. The method for manufacturing an array substrate of a transflective LCD as claimed in claim 1, wherein the first photo-masking operation uses a grey-tone mask or a half-tone mask to perform exposure, development, and etching on the transparent electrode layer and the first metal layer to form the gate terminal and the pixel electrode of the predetermined pattern, the gate terminal being formed on the substrate with a portion of the transparent electrode layer and a portion of the first metal layer that is disposed on said portion of the transparent electrode layer, the pixel electrode and the gate terminal being spaced from each other, the pixel electrode being formed with another portion of the transparent electrode layer.

3. The method for manufacturing an array substrate of a transflective LCD as claimed in claim 1, wherein the third photo-masking operation uses a grey-tone mask or a half-tone mask to perform exposure, development, and etching on the semiconductor layer and the second metal layer to form the channel layer, the drain terminal, the source terminal, and the reflector section of the predetermined pattern, the channel layer being formed on the gate insulation layer and partly extending to the pixel electrode, the drain terminal and the source terminal being spaced and respectively arranged at two ends of the channel layer, the drain terminal having an end extending along the channel layer to reach the pixel electrode, the reflector section being located on the pixel electrode.

4. The method for manufacturing an array substrate of a transflective LCD as claimed in claim 1, wherein the transparent electrode layer comprises indium tin oxide layer.

5. The method for manufacturing an array substrate of a transflective LCD as claimed in claim 1, wherein after Step 7, Step 8, in which a planarization layer is formed on the thin-film transistor, is included.

6. The method for manufacturing an array substrate of a transflective LCD as claimed in claim 5, wherein the planarization layer of Step 8 comprises a transparent insulation layer.

7. The method for manufacturing an array substrate of a transflective LCD as claimed in claim 1, wherein the first metal layer, the second metal layer, and the transparent electrode layer are formed with sputtering operations.

8. The method for manufacturing an array substrate of a transflective LCD as claimed in claim 5, wherein the insulation layer, the semiconductor layer, and the planarization are formed with chemical vapor deposition operations.

* * * * *